United States Patent [19]

Acher

[11] Patent Number: 5,034,740
[45] Date of Patent: Jul. 23, 1991

[54] CAPACITIVE CARD MODULE

[75] Inventor: Gottfried Acher, Koenigsbrunn, Fed. Rep. of Germany

[73] Assignee: Siemens Aktiengesellschaft, Munich, Fed. Rep. of Germany

[21] Appl. No.: 411,743

[22] Filed: Sep. 25, 1989

[30] Foreign Application Priority Data

Sep. 30, 1988 [DE] Fed. Rep. of Germany ... 8812393[U]
Jan. 27, 1989 [DE] Fed. Rep. of Germany ... 8900946[U]

[51] Int. Cl.[5] .................. H03K 17/94; H01H 35/00
[52] U.S. Cl. .................................... 341/33; 341/22; 307/116
[58] Field of Search ............. 341/33, 22, 26, 34; 340/711; 307/113, 116; 200/5 A

[56] References Cited

U.S. PATENT DOCUMENTS

| 3,240,885 | 3/1966 | Grunfelder et al. | 341/34 |
| 3,668,417 | 8/1972 | Sessler et al. | 341/34 |
| 4,090,092 | 5/1978 | Serrano | 307/116 |
| 4,326,195 | 4/1982 | Seki et al. | 341/22 |
| 4,336,529 | 6/1982 | Buan | 341/24 |
| 4,405,917 | 9/1983 | Chai | 341/26 |
| 4,539,554 | 9/1985 | Jarvis et al. | 341/34 |
| 4,876,461 | 10/1989 | Gratke | 307/116 |

FOREIGN PATENT DOCUMENTS 0305931 3/1989 European Pat. Off.

Primary Examiner—Donald J. Yusko
Assistant Examiner—Yuk H. Lau
Attorney, Agent, or Firm—Hill, Van Santen, Steadman & Simpson

[57] ABSTRACT

A capacitive card module is composed of a plurality of capacitive switch elements arranged on a carrier layer. In order to reduce parasitic coupling capacitances, the carrier layer is provided with a first shielding surface fashioned as an interconnect grid and connected to a voltage potential, and second shielding surfaces are located in the grid regions of the first shielding surface. The first shielding surface is composed of a conductor material that is electrically more conductive than that of the second shielding surfaces.

3 Claims, 1 Drawing Sheet

CAPACITIVE CARD MODULE

BACKGROUND OF THE INVENTION

1. Field of the Invention

The present invention relates to a capacitive card module which has a plurality of capacitive switch elements arranged side-by-side on an insulating carrier layer and which are connected to one another and respectively composed of conductor surfaces allocated to one another and fashioned into capacitor surfaces.

2. Description of the Prior Art

Capacitive card modules are being utilized to an increasing degree in newly-designed keyboards of professional data processing technology in order to improve the reliability of the keyboards and in order to simultaneously reduce the manufacturing cost.

European patent application Serial No. 88 11 3995.0, for example, discloses a keyboard mechanism wherein a key plate, together with a frame element and a seating part, is fashioned as a one-piece formed part and whereby a capacitive card module is directly secured to the underside of the key plate.

Compared to traditional keyboards whose keys act on switch elements that, via a respective galvanic contact, connect a row line and a column line to one another in a key matrix, the row and column lines in keyboards having capacitive switch elements are not galvanically connected to one another.

For this reason, decoupling elements such as, for example, respective diodes connected in series with the galvanic contacts are likewise not required.

A capacitive switch element can be realized in a simple manner with two conductor surfaces fashioned on a conductor card to form capacitor surfaces these conductor surfaces being connected to respective row lines or, respectively, column line of the key matrix. The actuation of a key merely produces a variation of the capacitance of an appertaining capacitive switch element. This can either occur on the basis of the basis of the approach of a dielectric element or, on the other hand, by reducing the distance between the capacitor surfaces can likewise occur by enlarging one of the capacitor surfaces.

A change in capacitance between row lines and column lines can be recognized with the assistance of an evaluation electronic circuit connected to all row and column lines and an actuated key can be identified with reference to the participating lines.

Function outages due to oxidized or deformed galvanic contacts, as well as due to malfunctioning decoupling element, can therefore not occur in keyboards having capacitive switch elements.

Since capacitive switch elements are composed only of individual conductor surfaces and the conductor surfaces are usually connected to one another via row and column lines, it was obvious for the purpose of reducing costs to provide a common printed circuitboard for all capacitive switch elements of a keyboard, no other electronic component being located on the printed circuitboard. As a rule, such a printed circuitboard is fashioned as a flexible PC foil and is then referred to as a capacitive switch foil.

Involved evaluation electronics is required for such capacitive switch foils obtainable in a great variety of embodiments, since only a very slight change in capacitance occurs as a rule given actuation of a capacitive switch element. Moreover, the change in capacitance to be recognized given actuation of a key is further reduced by parasitic coupling capacitances that can form due to interconnects extending in parallel to one another due to capacitive switching elements lying in tight proximity to one another.

It is therefore an object of the present invention to improve a capacitive card module of the type set forth above such that the influence of parasitic coupling capacitances is reduced.

The above object is achieved, according to the present invention in a capacitive card module having a plurality of capacitive switch elements arranged side-by-side on an insulated carrier member and connected to one another, the capacitive switch elements being respectively composed of conductor surfaces allocated to one another and fashioned into capacitor surfaces, and is characterized in that the insulating carrier layer comprises an electrically conductive first shielding surface fashioned as an interconnect grid at its side facing away from the capacitive switch elements and is provided with a terminal for voltage potential, in that the first shielding surface comprises a second shielding surface in mesh regions which are in electrical contact with the first shielding surface, in that the first shielding surface is composed of a conductor material that is electrically more conductive than that of the second shielding surfaces. According to another feature of the invention, the second shielding surfaces form a closed area and cover the first shielding surface at at least one side.

According to another feature of the invention, the conductor material of the first shielding surface is composed of silver and that of the second shielding surface is composed of graphite.

The expense for the evaluation electronics can be kept low with a card module constructed in accordance with the present invention. The reason for this become clear only given the assumption that the interconnect surfaces of the first shielding surface are negligible overall compared to the surface covered by the second shielding surfaces. It is then assured, in particular, that the two arbitrary lines (row-column lines) of the capacitive card module between which a parasitic coupling capacitance may exist under certain circumstances no longer have any coupling capacitances to the first shielding surface, but do have to the second shielding surfaces.

In principle, coupling capacitances to shielding surfaces are desired so that the electrical noise charges can be coupled by parasitic coupling capacitances from a disturbing line onto a disturbed line can flow off to a voltage potential, usually to ground potential. This is possible in the capacitive card module constructed in accordance with the present invention because the second shielding surfaces are electrically connected to the first shielding surface and the latter is connected to a voltage potential (ground potential). Since, then, both the disturbing as well as the disturbed lines are each connected to the voltage potential via coupling capacitances, these two coupling capacitances are fundamentally connected in series and are therefore connected in parallel to the parasitic coupling capacitance. What is disadvantageous is that the parasitic coupling capacitance is thereby further increased and electrical noise charges can increasingly flow onto the disturbed line.

In the ideal case, electrical noise charges should flow off via the coupling capacitance to the shielding surface and should then flow optimally unimpeded to a voltage potential (ground potential). Electrical noise charges, however, should be impeded from flowing via the coupling capacitances and a shielding surface from one line to another line, for example from a row line onto a column line.

This is achieved in the card module constructed in accordance with the present invention in that the second shielding surfaces have a lower electrical conductivity when compared to the first shielding surface. Electrical noise charges that proceed via a coupling capacitance onto the second shielding surfaces must overcome a certain resistance (for example 10 ohms given graphite) dependent on the electrical conductivity of the second shielding surface until they arrive onto an interconnect of the first shielding surface in which they can then flow off to the voltage potential without impediment (extremely good conductivity, for example 1 ohm given silver). In order to return via a coupling capacitance onto a line, the electrical noise charges would then again have to overcome the resistance of the second shielding surfaces, for which reason the plurality of noise charges proceeding via the shielding surfaces onto a line can be kept low with a card module constructed in accordance with the present invention compared to what is possible given card modules that comprise only one shielding surface composed of a single continuous area.

The conductor materials of silver and graphite can be galvanically combined with one another without problems and also well-suited for being applied in a silk screening process. In order to protect the unusually thin interconnects of the interconnect grid, it is advantageous to fashion the second conductor surfaces as a closed surface and to cover the interconnect grid as a whole. Moreover, the expense for the application of the second shielding surfaces in a silk screening process is thus reduced.

BRIEF DESCRIPTION OF THE DRAWINGS

Other objects, features and advantages of the invention will be best understood from the following detailed description, taken in conjunction with the accompanying drawing, on which.

DESCRIPTION OF THE PREFERRED EMBODIMENTS

Figure 1:
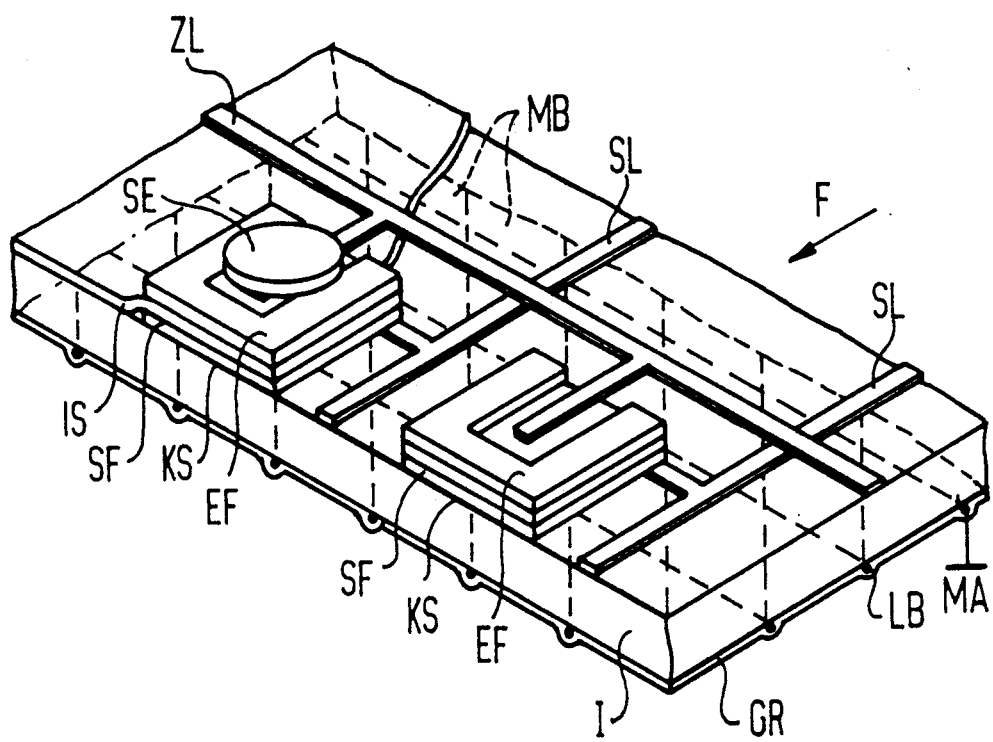
FIG. 1 is a perspective view of the basic structure of the capacitive card module, shown partially in section.

FIG. 1 illustrates a partial section of a capacitive card module F in a schematic view. Two capacitive switch elements KS that are arranged side-by-side on a common carrier I are shown in a perspective side view. These capacitive switch elements KS are each composed of two conductor surfaces lying parallel above one another that are separated from one another by an insulating layer IS and are thus fashioned to form capacitor surfaces, namely, an excitation surface EF and a sensor surface SF. The sensor surfaces SF of the capacitive switch elements KS are each connected to a column line SL of the key matrix (not shown). The excitation surfaces EF have no galvanic connection whatsoever in the unactuated condition of the respectively appertaining key. Only upon actuation of the key is a contact element SE appertaining thereto lowered onto the respective excitation surface EF and onto a row line ZL appertaining thereto, whereby a galvanic connection between the excitation surface EF and the row line ZL is produced.

An interconnect grid (shown with broken lines) whose mesh regions MB each have roughly an area of one square centimeter adheres to that surface of the carrier layer I lying opposite to the capacitive switch elements KS. The interconnects LB of the interconnect grid are about 0.3 mm wide. The entire interconnect grid is covered with a closed layer of graphite GR.

Figure 2:
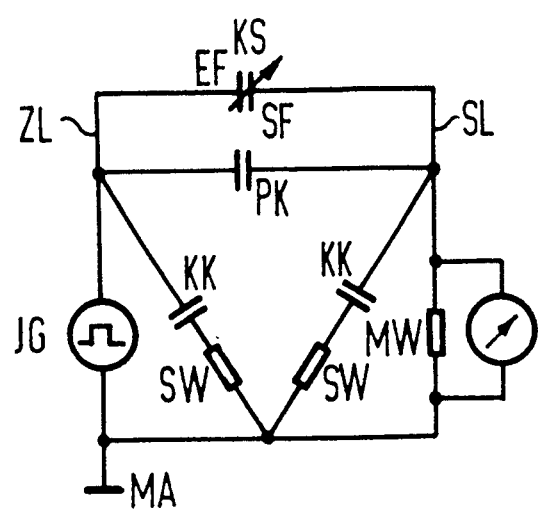
FIG. 2 is a circuit diagram illustrating the capacitive relationships.

FIG. 2 shows a circuit diagram wherein the electrical interaction of the individual coupling capacitances on the capacitive card module of the invention may be seen.

A capacitive switch element KS symbolized as a variable capacitor has its excitation surface EF connected to a pulse generator JG via a row line ZL. The capacitive switch element KS whose capacitance depends on the actuation of the key has its sensor surface SF connected to a precision resistor MW via a column line SL. The pulse generator JG and the precision resistor MW lie at a common ground potential MA.

A parasitic coupling capacitance PK that arises due to lines extending in parallel therefore lies between the row line and the column line SL and ZL and, therefore, parallel to the capacitive switch element KS. The column lines and row lines SL and ZL moveover are each connected to the ground potential MA via a series circuit composed of a coupling capacitance KK and a shielding surface resistor SW. The coupling capacitance KK thus represents a capacitance that respectively forms between a row line or a column line ZL or SL and the second shielding surfaces, i.e. the graphite layer GR. The shielding surface resistance SW is the resistance that must be overcome in the graphite layer in order to proceed onto an interconnect LB of the interconnect grid. The resistance in the interconnect grid is negligible and is therefore not shown.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. In a capacitive card module of the type wherein a plurality of capacitive switch elements are arranged side-by-side on an insulating carrier layer and connected to one another and are respectively composed of conductor surfaces allocated to one another and fashioned into capacitor surfaces, the improvement comprising:

an electrically conductive first shielding surface including a plurality of interconnects constructed as an interconnect grid on the side of the insulating carrier layer facing away from the capacitive switch elements and defining mesh regions bounded by said interconnects, said first shielding surface including a terminal for connection to a voltage potential;

said first shielding surface comprising second shielding surfaces in said mesh regions, said second shielding surfaces electrically connected to said first shielding surface; and said first shielding surface comprising a conductor material that is electrically more conductive than the conductor material of said second shielding surfaces.

2. The improved capacitive card module of claim 1, wherein:

said second shielding surfaces form a closed area and cover said first shielding surface at at least one side.

3. The improved capacitive card module of claim 1, wherein:

said first shielding surface comprises silver and said second shielding surfaces comprise graphite.

* * * * *